(12) United States Patent
Alwan et al.

(10) Patent No.: US 10,955,312 B2
(45) Date of Patent: Mar. 23, 2021

(54) VEHICLE IMPACT ANALYSIS

(71) Applicant: Ford Global Technologies, LLC, Dearborn, MI (US)

(72) Inventors: Jamil M. Alwan, Ann Arbor, MI (US); Maya Makhlouf, Ann Arbor, MI (US); Thiag Subbian, Farmington Hills, MI (US); Djamal Eddine Midoun, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 155 days.

(21) Appl. No.: 16/271,128

(22) Filed: Feb. 8, 2019

(65) Prior Publication Data

US 2020/0256764 A1 Aug. 13, 2020

(51) Int. Cl.
| | |
|---|---|
| *G06F 30/15* | (2020.01) |
| *G06F 30/20* | (2020.01) |
| *G06F 30/23* | (2020.01) |
| *G06F 30/17* | (2020.01) |
| *G01M 17/007* | (2006.01) |

(52) U.S. Cl.
CPC ......... *G01M 17/0078* (2013.01); *G06F 30/15* (2020.01); *G06F 30/20* (2020.01); *G06F 30/17* (2020.01); *G06F 30/23* (2020.01)

(58) Field of Classification Search
CPC .......... G06F 30/00; G06F 30/15; G06F 30/17; G06F 30/20; G06F 30/23; G01M 17/0078
See application file for complete search history.

(56) References Cited

U.S. PATENT DOCUMENTS

| | | | |
|---|---|---|---|
| 5,652,375 A | 7/1997 | Da Re' | |
| 5,861,544 A | 1/1999 | Kosaraju et al. | |
| 8,365,618 B2 | 2/2013 | Kruse | |
| 9,976,935 B2 | 5/2018 | Belwafa et al. | |
| 2005/0197822 A1* | 9/2005 | Onodera | G06F 30/23 703/22 |
| 2012/0136640 A1* | 5/2012 | Ito | G01M 17/0078 703/8 |
| 2015/0088474 A1* | 3/2015 | Frost | G06F 30/23 703/6 |
| 2016/0161372 A1 | 6/2016 | Eom et al. | |
| 2020/0257771 A1* | 8/2020 | Meaige | G06F 30/20 |

FOREIGN PATENT DOCUMENTS

| | | | | |
|---|---|---|---|---|
| CN | 106126849 A | * | 11/2016 | |
| CN | 107609215 A | * | 1/2018 | |
| KR | 101834311 B1 | | 3/2018 | |
| WO | WO-2011016499 A1 | * | 2/2011 | G01M 7/08 |

* cited by examiner

*Primary Examiner* — Jonathan M Dunlap
(74) *Attorney, Agent, or Firm* — Frank A. MacKenzie; Bejin Bieneman PLC

(57) ABSTRACT

A method includes simulating an impact between a simulated wheel and a simulated vehicle assembly, the simulated vehicle assembly including a simulated vehicle component that is a computer-aided-design model of a vehicle component. The method includes determining, based on the simulated impact, an impact angle between the simulated wheel and the simulated vehicle assembly. The method includes impacting an impactor with the vehicle component at the impact angle.

20 Claims, 9 Drawing Sheets

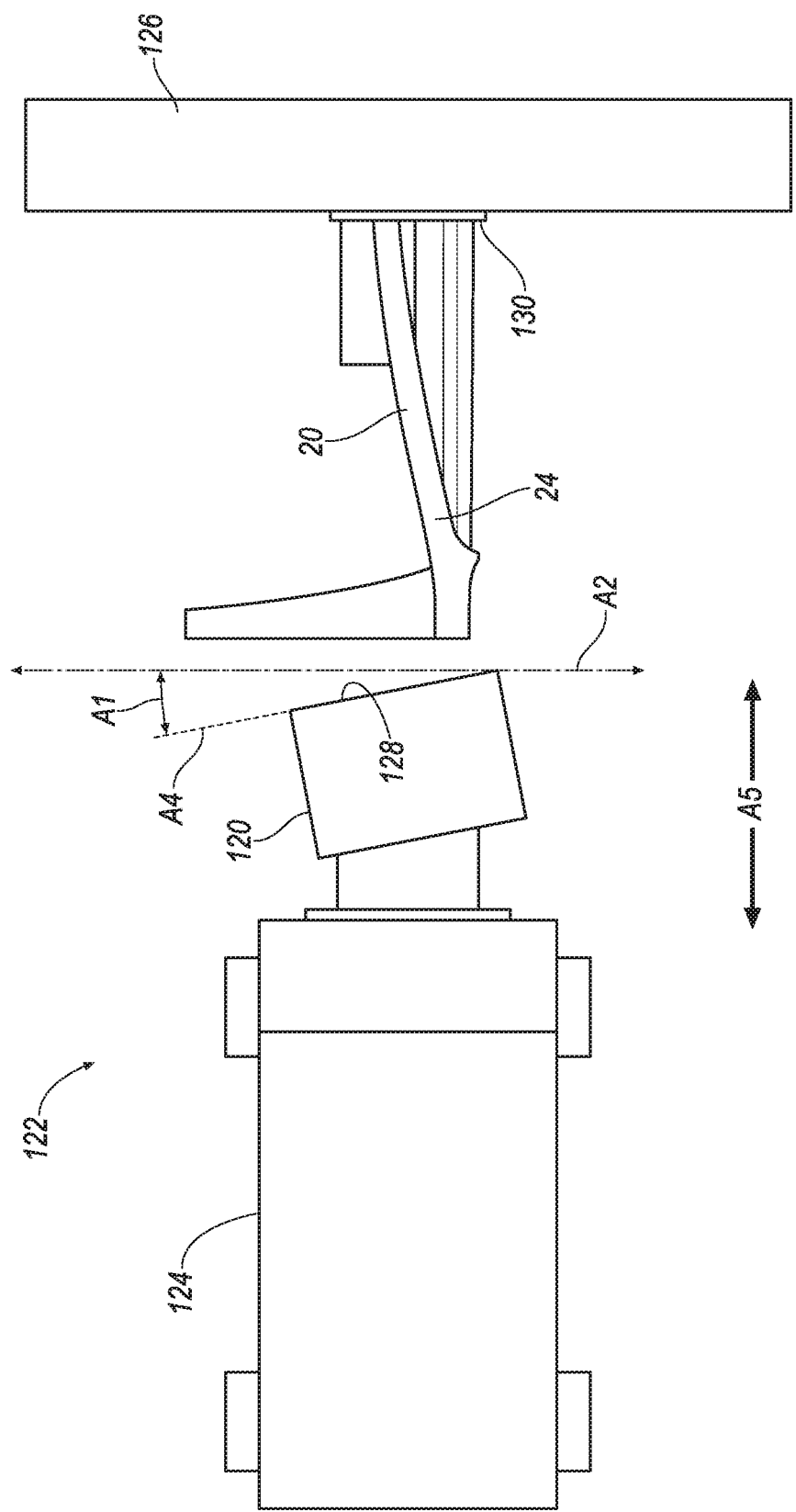

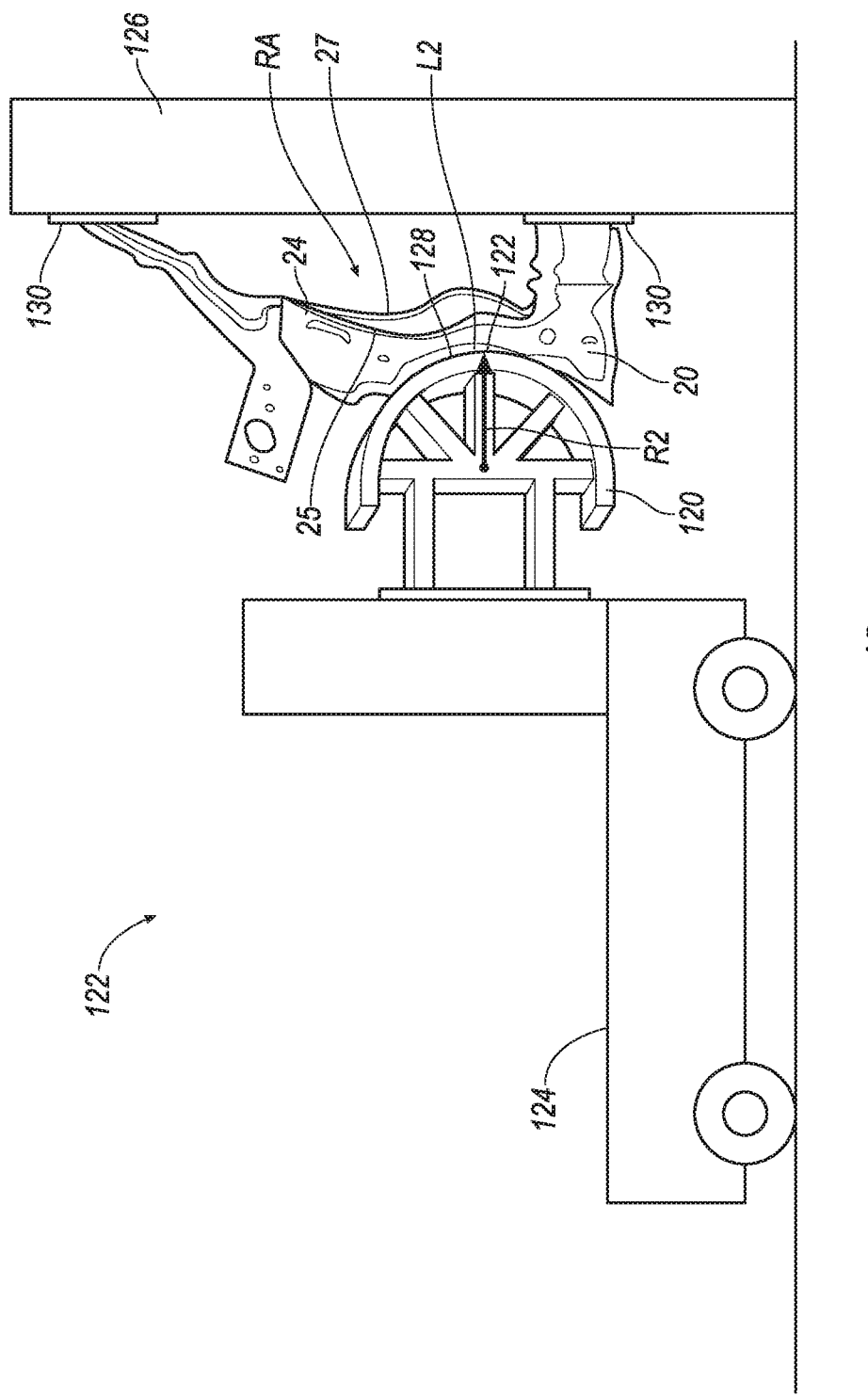

VEHICLE IMPACT ANALYSIS

BACKGROUND

A vehicle may be subjected to a crash test to that may indicate an integrity of one or more components of the vehicle. Example crash tests include frontal-impact tests, moderate overall, small overall tests, etc. Standards for crash tests may be specified by various organizations, such as the U.S.A. Insurance Institute for Highway Safety (IIHS), the European New Car Assessment Programme (EuroNCAP), Australasian New Car Assessment Program (ANCAP), New Car Assessment Program for Southeast Asia (ASEAN NCAP), and the Global New Car Assessment Program (Global NCAP). Conducting a crash test typically involves the use of a fully assembled vehicle, which can be costly for determining integrity of a single vehicle component.

BRIEF DESCRIPTION OF THE DRAWINGS

FIG. 3 is a top view of the crash test apparatus.

FIG. 4 is a side view of the crash test apparatus impacting a vehicle component.

DETAILED DESCRIPTION

Introduction

Figure 1:
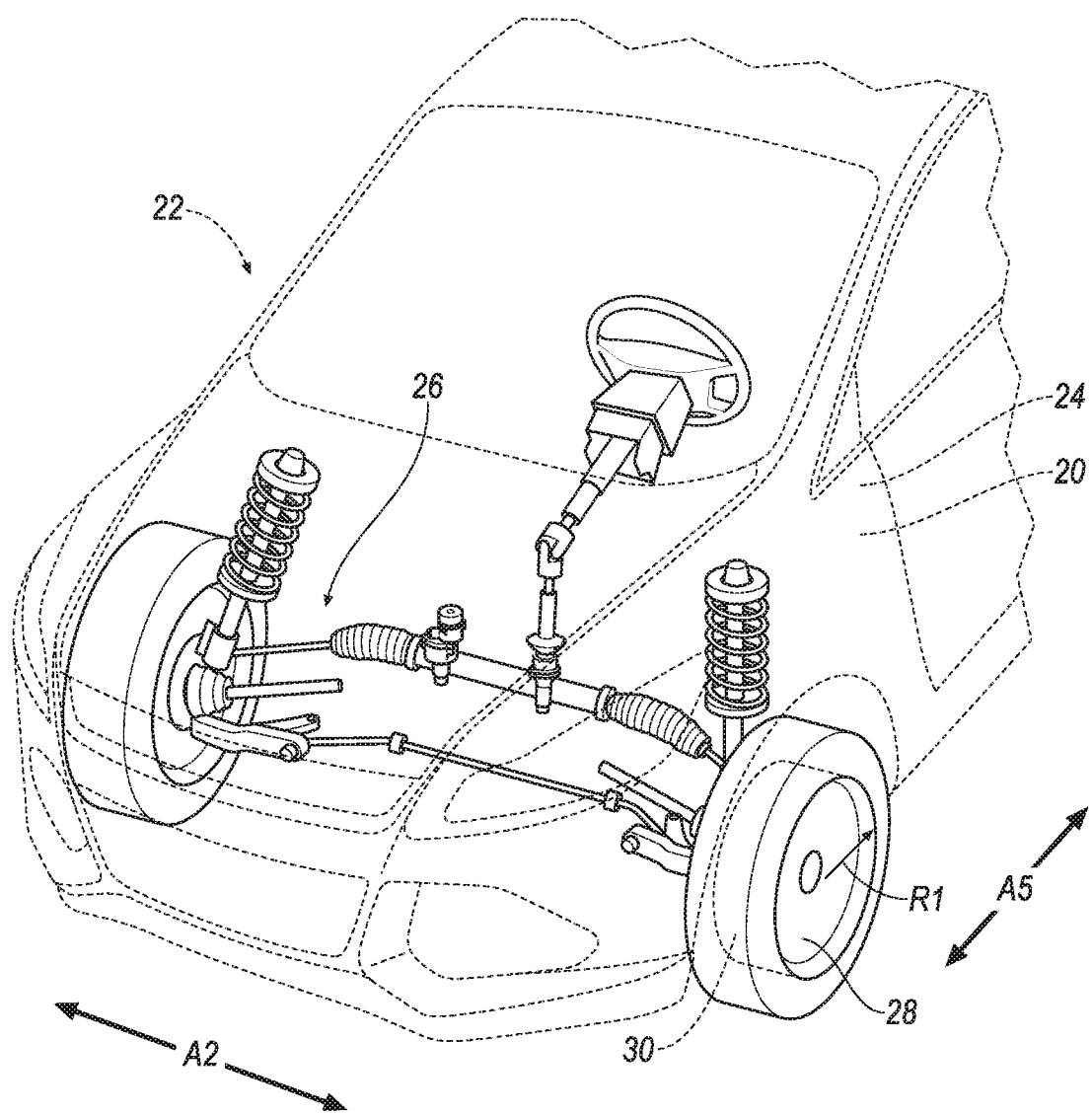
FIG. 1 is a perspective view of a vehicle.

A method includes simulating an impact between a simulated wheel and a simulated vehicle assembly, the simulated vehicle assembly including a simulated vehicle component that is a computer-aided-design model of a vehicle component. The method includes determining, based on the simulated impact, an impact angle between the simulated wheel and the simulated vehicle assembly. The method includes impacting an impactor with the vehicle component at the impact angle.

The method may include fixing the impactor relative to a sled based on the impact angle.

The impactor may include an arched impact surface.

The method may include determining an amount of energy absorbed by the simulated vehicle component during the simulated impact.

The method may include determining at least one of a mass and a speed for a sled used to impact the impactor with the vehicle component based on the amount of energy absorbed by the simulated vehicle component during the simulated impact.

The method may include impacting the impactor with the vehicle component includes using at least one a sled having the determined mass and a sled moving at the determined speed.

The method may include comparing a detected amount of energy absorbed by the vehicle component during the impact with the amount of energy absorbed by the simulated vehicle component during the simulated impact.

Determining the amount of energy absorbed by the simulated vehicle component may be based on a simulated deformation of the simulated vehicle component during the simulated impact.

The method may include determining at least one of a mass and a speed for a sled used to impact the impactor with the vehicle component based on a simulated impact between a simulated sled having a simulated impactor and the simulated vehicle component.

The simulated vehicle assembly may include a simulated vehicle suspension supporting the simulated wheel relative to the simulated vehicle component.

The simulated vehicle component may include a simulated A-pillar.

The method may include mounting the impactor to a sled and mounting the vehicle component to a barrier.

The method may include identifying a reinforcement area on the vehicle component after impacting the impactor with the vehicle component.

The method may include updating a design for the vehicle component based on the reinforcement area.

The method may include adding reinforcement to a second vehicle component based on the reinforcement area.

Adding reinforcement may include fixing a first part of the second vehicle component to a second part of the second vehicle component with at least one of a weld, a fastener, or an adhesive.

The method may include determining an impact location on the simulated vehicle component based on the simulated impact.

The method may include impacting the impactor with the vehicle component at the impact location.

The method may include generating the computer-aided-design model of the vehicle component with parameters representative of the vehicle component.

With reference to the Figures, wherein like numerals indicate like parts throughout the several views, a method, such a process 700 for testing integrity of a vehicle component 20 includes simulating an impact between a simulated wheel 220 and a simulated vehicle assembly 222, the simulated vehicle assembly 222 including a simulated vehicle component 224 that is a computer-aided-design (CAD) model of the vehicle component 20. The method includes determining, based on the simulated impact, an impact angle A1 between the simulated wheel 220 and the simulated vehicle assembly 222. The method includes impacting an impactor 120 with the vehicle component 20 at the impact angle A1. The impact angle A1 may be between a cross-vehicle axis A2 and an axis A3 of the simulated wheel 220 of an axis A4 of an impact surface 128 of the impactor 120. The method can decrease the cost and time associated with determining an integrity of the vehicle component 20 by providing crash test parameters, such as an impact angle A1, for crash testing the vehicle component 20 without requiring that the vehicle component 20 be crash tested as part of a vehicle 22.

Vehicle

With reference to FIG. 1, the vehicle 22 may be any type of passenger or commercial automobile such as a car, a truck, a sport utility vehicle, a crossover vehicle, a van, a minivan, a taxi, a bus, etc. The vehicle 22 defines a vehicle-longitudinal axis A5, i.e., extending between a front and a rear of the vehicle 22. The vehicle 22 defines the cross-vehicle axis A2, i.e., extending between a left side and a right side of the vehicle 22. The vehicle-longitudinal axis A5 and the cross-vehicle axis A2 are perpendicular to each other. The front, rear, left and right sides, and relative directions used herein (such forward, rearward, upward, downward, etc.) may be relative to an orientation of an occupant of the vehicle 22. The front, rear, left and right sides, and relative directions used herein may be relative to an orientation of controls for operating the vehicle 22, e.g., a steering wheel, etc. The front, rear, left and right sides, and relative directions used herein may be relative to a driving direction of the vehicle 22 when wheels of the vehicle are all parallel with each other. Orientation and direction relative to the vehicle 22, such as the axis A2, A5, apply to components of the vehicle 22 as if such components were supported on the vehicle 22 as described below and shown in the figures.

The vehicle component 20 is an individual component of the vehicle 22, an assembly of the vehicle 22, a subassembly of the vehicle 22, etc. For example, the vehicle component 20 may be a component of a frame and/or a body of the vehicle 22 (such as an A-pillar 24, a rocker, etc.). The vehicle component 20 may be metal, ceramic, or any suitable material.

The body and frame may be of a unibody construction. In the unibody construction, the body serves as the vehicle frame, and the body (including the rockers, pillars, roof rails, wheel arches, etc.) is unitary, i.e., a continuous one-piece unit. As another example, the body and frame may have a body-on-frame construction (also referred to as a cab-on-frame construction). In other words, the body and frame are separate components, i.e., are modular, and the body is supported on and affixed to the frame. Alternatively, the body and frame may have any suitable construction. The body and/or the frame may be formed of any suitable material, for example, steel, aluminum, etc.

A wheel 28 may be mounted to the frame of the vehicle 22, e.g., via suspension and/or steering assembly components 26. The wheel 28 includes an outer surface 30 that extends circumferentially about the wheel 28. In other words, the outer surface 30 may have a cylindrical shape. The outer surface 30 defines a radius of curvature R1 of the wheel 28. The outer surface 30 defines a width of the wheel 28, i.e., axially measured along the outer surface 30 relative to the radius of curvature R1. The wheel 28 may support a tire at the outer surface 30.

During an impact to the vehicle 22, such as a frontal impact, force from the impact may urge the wheel 28 rearward, and the wheel 28 may contact the body and/or the frame of the vehicle 22, e.g., the wheel 28 may contact the A-pillar 24. Vehicle components, such as suspension and/or steering assembly components 26, may restrict and resist moment of the wheel 28 and influence a location and angle at which the wheel 28 contacts the body and/or the frame of the vehicle 22.

Crash Test Apparatus

Figure 2:
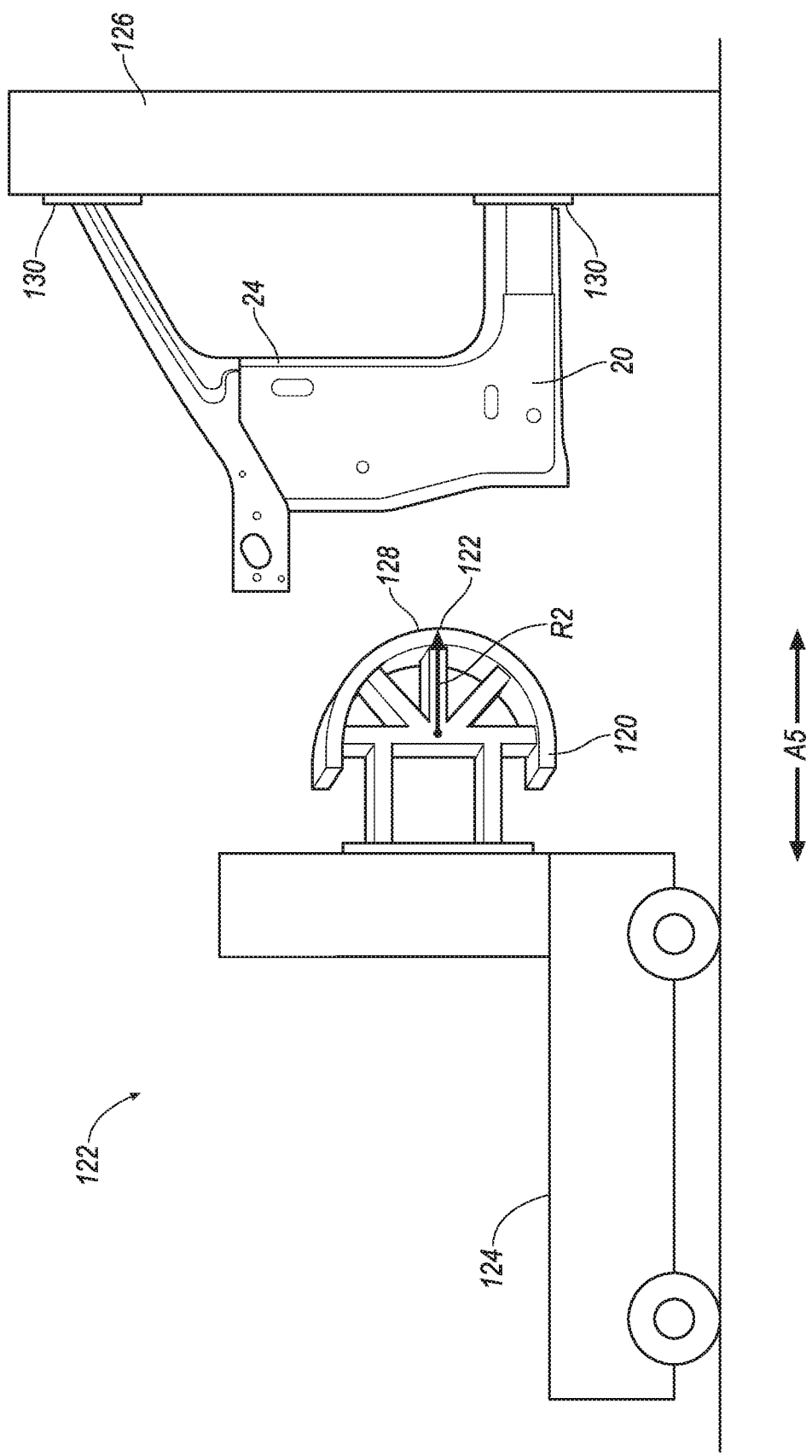
FIG. 2 is a side view of a crash test apparatus.
Figure 5A:
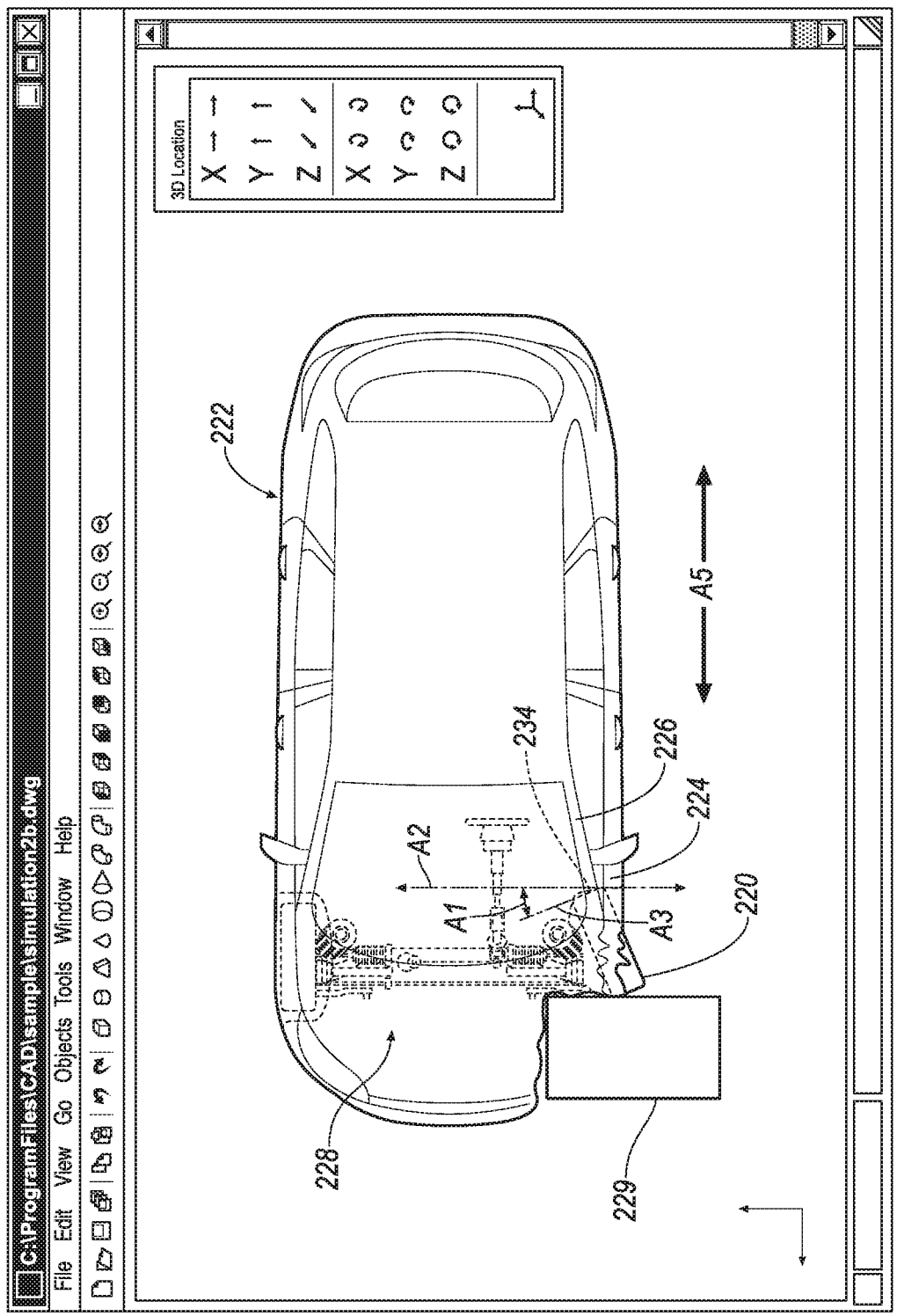
FIG. 5a is an illustration of computer-aided-design software executed on a computer to show a top view of a simulated vehicle impact.
Figure 5B:
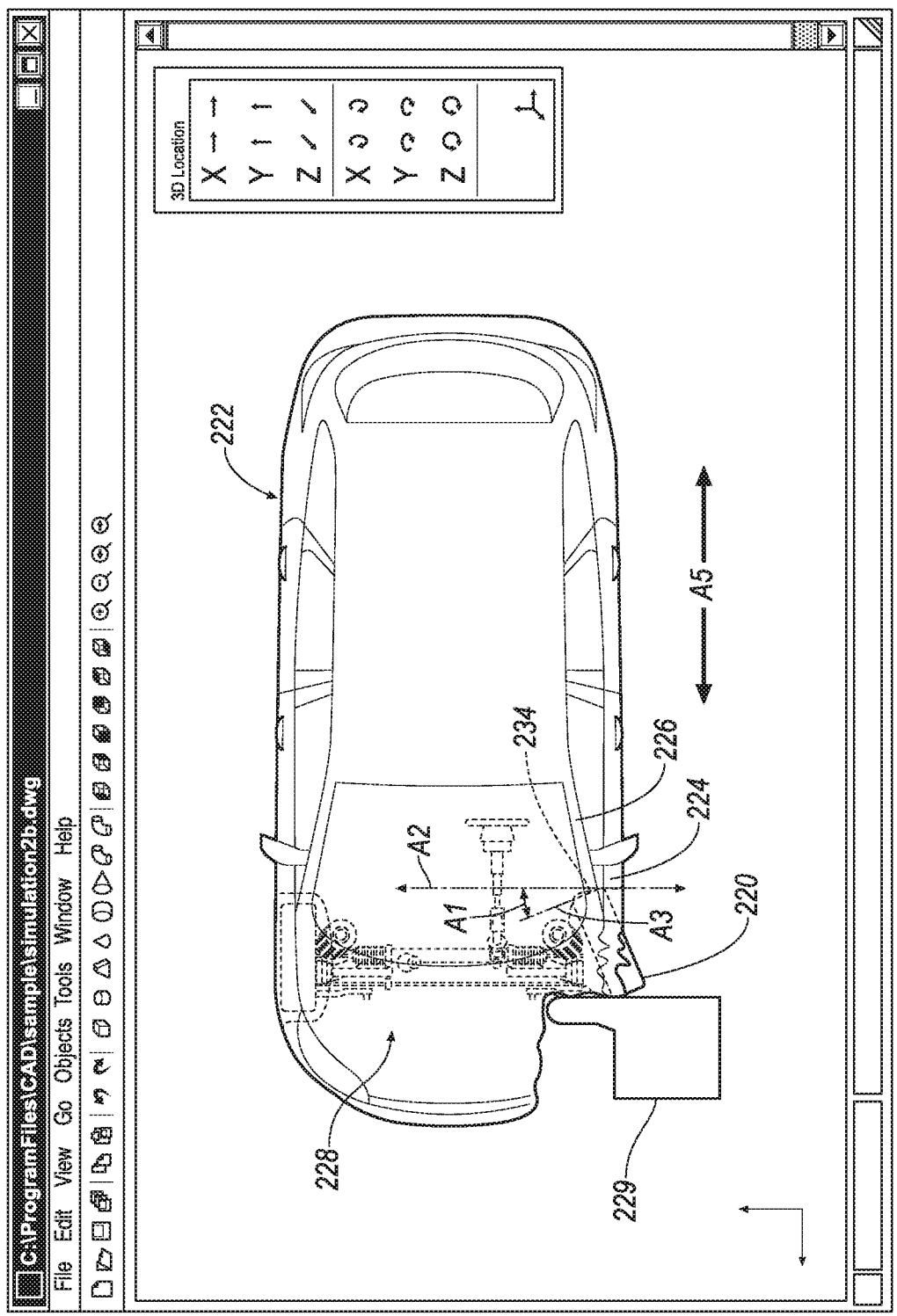
FIG. 5b is an illustration of computer-aided-design software executed on a computer to show a top view of another simulated vehicle impact.
Figure 6:
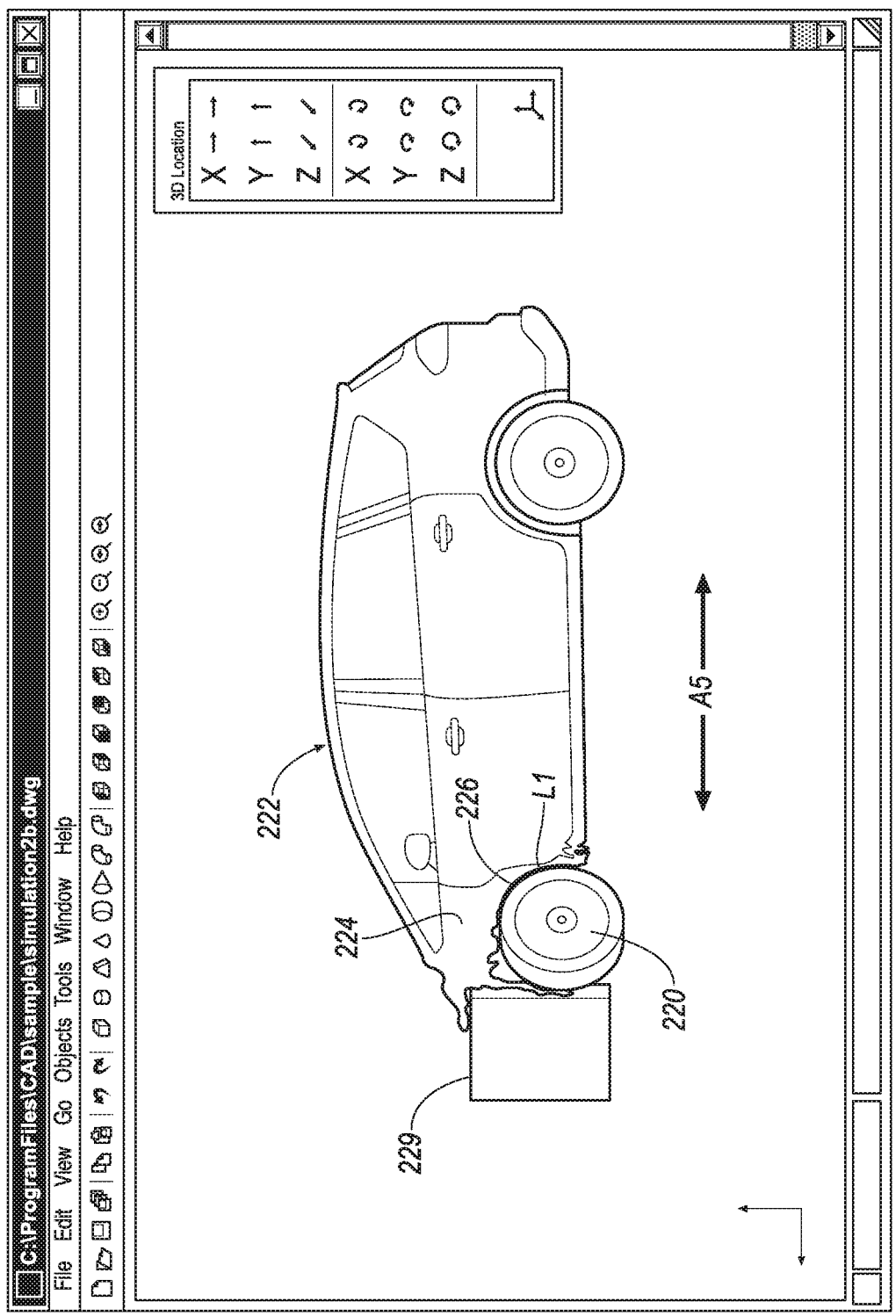
FIG. 6 is an illustration of the computer-aided-design software showing a side view of the simulated impact.
Figure 7:
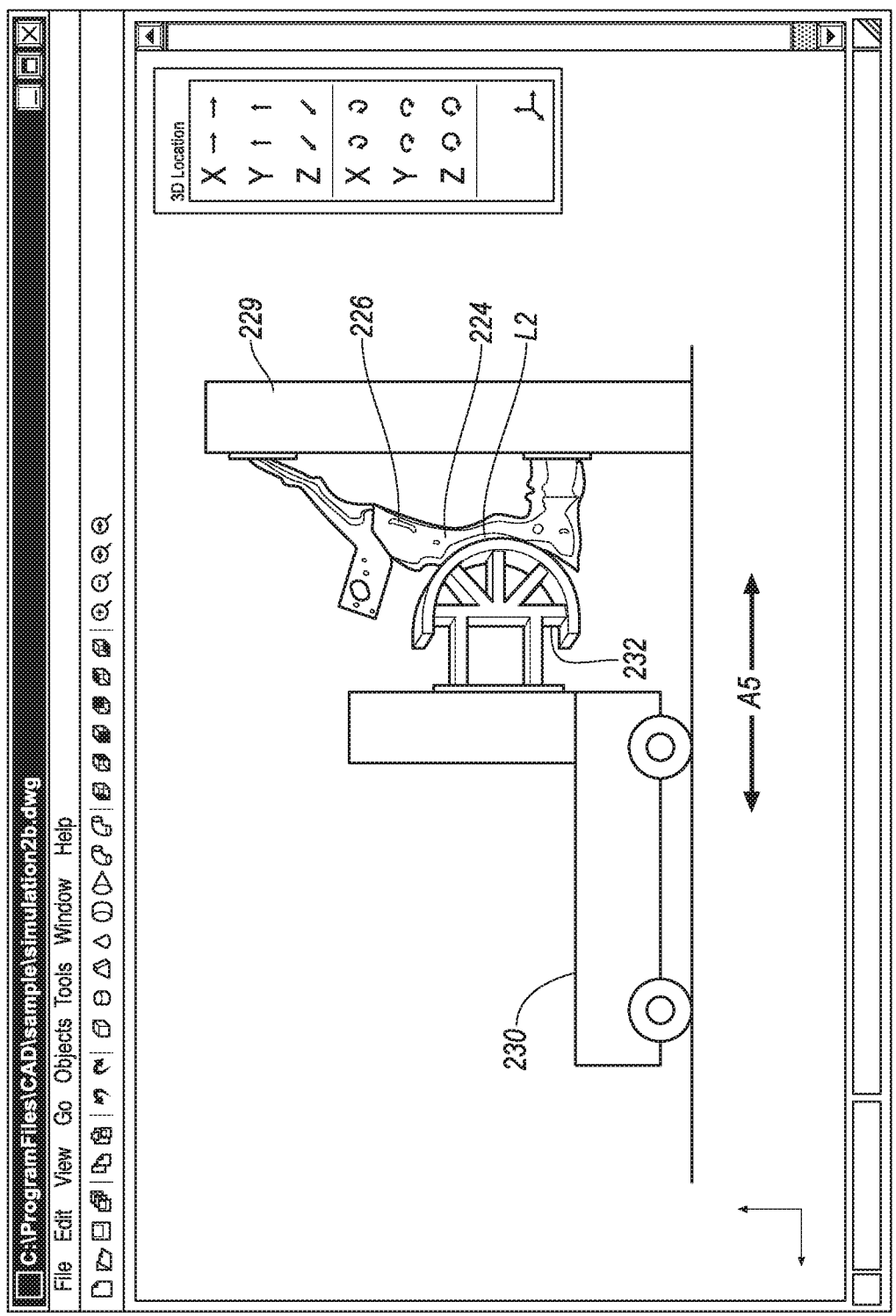
FIG. 7 is an illustration of computer-aided-design software executed on a computer to show a side view of a simulated crash test apparatus impact.

With reference to FIGS. 2-4, a crash test apparatus 122 is used for conducting a crash test of the vehicle component 20. The crash test apparatus 122 includes a sled 124 that is moveable toward a barrier 126, e.g., along a track using conventional systems and methods. An impactor 120 may be mounted to the sled 124 and a vehicle component 20 may be mounted to the barrier 126, or vice versa. Moving the sled 124 toward the barrier 126 may cause an impact between the impactor 120 and the vehicle component 20.

The impactor 120 includes an impact surface 128. The impact surface 128 impacts the vehicle component 20 when the sled 124 used to impact the impactor 120 is moved toward the vehicle component 20. The impact surface 128 may have an arch shape. The arch of the impact surface 128 may define a radius of curvature R2. The radius of curvature R2 of the arch shape may be the same as the radius of curvature R1 of the wheel 28 of the vehicle 22. The impact surface 128 defines a width, e.g., measured along the axis A4 of the impact surface 128. The width of the impact surface 128 may be the same as the width of the wheel 28.

The impactor 120 may be fixed to the sled 124 or barrier 126 at a specific position and/or angle, e.g., relative to the vehicle component 20. Fixing the impactor 120 at a specific position and/or angle permits the impact between the impactor 120 and the vehicle component 20 to replicate an impact between the wheel 28 the vehicle component 20. For example, the impactor 120 may impact the vehicle component 20 at a location L2 on the vehicle component 20 and at an impact angle A1 that is the same as a location L1 of impact on the simulated vehicle component 224 and at the impact angle A1 between the simulated vehicle component 224 and the simulated wheel 220.

The crash test apparatus 122 may include one or more load detecting devices 130. The load detecting devices 130 detect force applied thereto. For example, the load detecting device 130 may be a load sensor, conventionally referred to as a strain gage. As another example, the load detection device may be a crush box. The crush box is a physical structure designed to deform a specified amount upon application of a specified force. The load detecting device 30 may specify any amount of energy applied thereto. For example, an amount of time that force is detected by the strain gage may be used to calculate the amount of energy applied to the strain gage. As another example, the deformation amount of the crush box may indicate the amount of energy applied to the crush box.

The load detecting devices 130 may be configured to detect an amount of force applied to, and/or energy absorbed by, a vehicle component 20 during a crash test. For example, one or more load detecting devices 130 may be support by the barrier 126 (see FIGS. 2-4) and/or sled 124 (not shown). The load detecting devices 130 may be positioned between the vehicle component 20 and the sled 124 or the barrier 126 such that application for force to the vehicle component 20, e.g., during a crash test, is transferred to the load detecting devices 130.

Computer Simulation

FIGS. 5a-7 illustrate a representation of a computer simulation. Computer simulation is used to simulate interactions between objects, e.g., to simulate a vehicle crash test. The computer simulation is performed with computer-aided-design (CAD) software executed on a computing device. The CAD software is executable by a processor of a computer to perform the simulations and other calculations, determinations, etc., described herein. The CAD software may be stored in memory of the computer. Example CAD software includes LS-DYNA® and RADIOSS.

The CAD software can generate simulations including models of physical components and assemblies. The simulation includes parameters that are representative of a geometry, a strength, an elasticity, a rigidity, a mass, a density, a hardness, etc., e.g., of a physical component. The simulation of the models may be generated by a user interfacing with the computer running the CAD software and inputting parameters for the model. The simulation of the models may be generated with one or more data databases. For example, a database may store parameters associated with different materials, e.g., the strength, elasticity, rigidity, density, hardness, etc., of a specific type of metal. The simulation of the models may be generated with data from a scanner or like device. For example, a three-dimensional scanner may provide parameters specifying a geometry of a physical component.

The CAD software can simulate a response to an application of force and interactions among the models of physical components and assemblies. The simulated interaction may specify how the modeled vehicle components may react to such force, e.g., move relative to other model components, deform, fracture, etc., as well as how much energy is absorbed by the deformation of the modeled vehicle components, e.g., using finite element analysis (FEA) and other conventional techniques and based on parameters of the simulation.

Process

Figure 8:
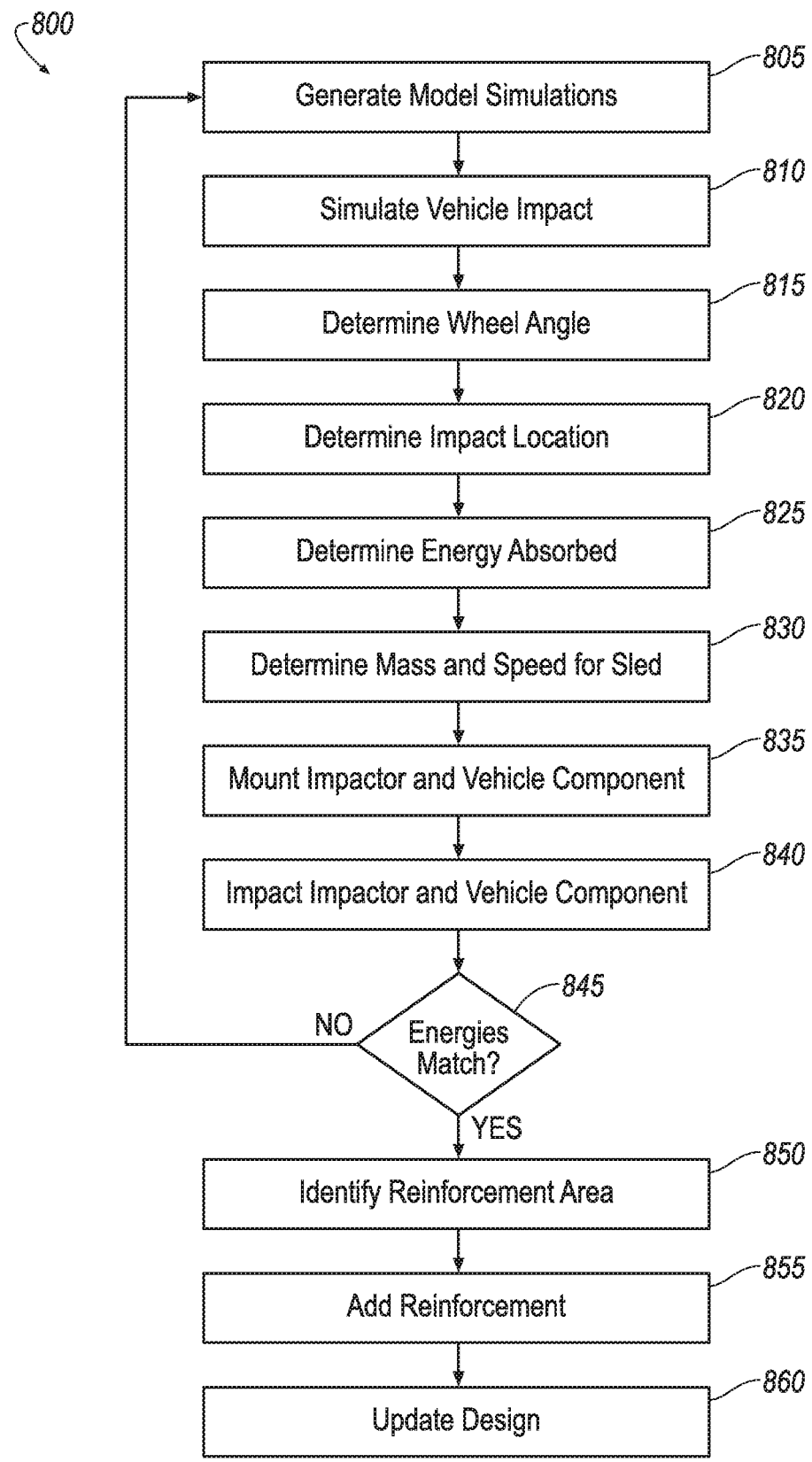
FIG. 8 is a flow chart illustrating a process for testing a vehicle component.

FIG. 8 is a process flow diagram illustrating an exemplary process 800 for testing integrity of a vehicle component 20. The process 800 begins in a block 805 where a computer running CAD software generates a simulated vehicle assembly 222. Generating the simulated vehicle assembly 222 includes generating a simulated vehicle component 224, such as a simulated A-pillar 226, a simulated wheel 220, a simulated vehicle suspension and/or steering components 228, etc. (shown in FIGS. 5a, 5b, and 6). The simulated vehicle suspension and/or steering components 228 supports the simulated wheel 220 relative to other simulated vehicle components 224 of the simulated vehicle assembly 222 (such as the simulated A-pillar 226).

The simulated vehicle assembly 222 and simulated vehicle components 224 are CAD models of vehicle components 20 of the vehicle 22. For example, the simulated A-pillar 226, simulated wheel 220, and simulated vehicle suspension and/or steering components 228 may include CAD models of the A-pillar 24, wheel 28, and suspension and/or steering assembly components 26, respectively. The simulated vehicle assembly 222 and simulated vehicle components 224 include parameters representative of the vehicle components 20 that the simulated vehicle component 224 are models of. For example, the simulated vehicle suspension and/or steering components 228 may include parameters for rebound and dampening rates that model the suspension and/or steering assembly components 26.

A computer may also generate a simulated barrier 229, a simulated sled 230, and a simulated impactor 232 (shown in FIGS. 5a-7) that are all CAD models of a barrier 126, a sled 124, and an impactor 120 of a crash test apparatus 122, respectively. Such simulations include parameters representative of the respective components.

Next, at a block 810 a computer running CAD software simulates an impact between the simulated wheel 220 and the simulated vehicle assembly 222 including a simulated vehicle component 224 that is a model of a vehicle component 20.

The CAD software may simulate the impact between the simulated wheel 220 and the simulated vehicle assembly 222 during a simulated crash test to the simulated vehicle assembly 222. The simulated crash test may be representative of a standardized crash test typically used to test the crash worthiness of a vehicle 22. For example, a computer running CAD software may simulate an impact between a simulated barrier 229 and a simulated vehicle assembly 222 (shown in FIGS. 5a, 5b, and 6). For example, the simulated impact may be an Offset Deformable Barrier type of impact (shown in FIG. 5a). As another example, the simulated impact may be a Small Offset Rigid Barrier type of impact (shown in FIG. 5b). The simulated impacted may be executed by the computer running CAD software and based on initial conditions that replicate a standardized crash test. For example, the simulated vehicle assembly 222 may be given an initial speed travelling at the barrier 126 as specified by a standardized crash test, e.g., as a parameter in the CAD software. The simulated vehicle assembly 222 may be given an initial position and orientation relative to the simulated barrier 229 based in a standardized crash test. For example, the simulated vehicle assembly 222 may be positioned and oriented relative to the simulated barrier 229 to simulate an Insurance Institute for Highway Safety (IIHS) small overlap frontal test. The position and orientations of the simulations may be relative to an x, y, z coordinate system of the CAD software.

The simulated impact may generate data for the simulated vehicle assembly 222 and simulated barrier 229 with respect to time. In other words, based on the initial conditions and parameters, the CAD software may output data specifying the geometry (including deformation from the original modeled geometry), position, orientation, internal and external forces, momentums, moments, etc., of the simulated vehicle assembly 222 (and the simulated vehicle components 224) and the simulated barrier 229 at timesteps, e.g. every 50 milliseconds. The data may be stored in the memory of the computer.

At a block 815, a computer running CAD software determines an impact angle A1 between the simulated wheel 220 and the simulated vehicle assembly 222. The impact angle A1 may be determined based on the simulated impact executed at the block 810.

For example, data of the simulated impact may be analyzed to identify a timestep at which the simulated wheel 220 contacts the simulated vehicle component 224 (e.g., the A-pillar 24). Data associated with such timestep may also specify an orientation of the simulated vehicle 22 and the simulated vehicle component 224 relative to each other. The orientation of the simulated wheel 220 and the simulated vehicle component 224 relative to each other defines the impact angle A1. The axis A3 of the simulated wheel 220 may be defined by a simulated cylindric outer surface 234 of the simulated wheel 220, as described above of the wheel 28.

At a block 820, a computer running CAD software determines an impact location L1 on the simulated vehicle component 224. The impact location L1 is based on the simulated impact executed at the block 810. The impact location L1 is where the simulated wheel 220 impacts the simulated vehicle component 224. The impact location L1 may be relative to a feature or structure of the simulated vehicle component 224. For example, one or more corners, edges, intersections, etc., may be used as datums that define an x, y, z coordinate system. With reference to the simulated impact illustrated in FIG. 6, the impact location L1 may be measured vertically from a bottom edge of the simulated A-pillar 226 or other feature.

For example, data of the simulated impact may be analyzed to identify a timestep at which the simulated wheel 220 contacts the simulated vehicle component 224 (e.g., the A-pillar 24). Data associated with such timestep may also specify the location L1 on the simulated vehicle component 224 that is impacted by simulated wheel 220.

At a block 825 a computer running CAD software determines an amount of energy absorbed by the simulated vehicle component 224 during the simulated impact executed at the block 810. For example, the computer running the CAD software may determine the amount of energy absorbed based on a simulated deformation of the simulated vehicle component 224 during the simulated impact and based on parameters of the simulated vehicle component 224 (such as geometry, strength, elasticity, etc.). Other conventional methods and techniques may be used to analyze the data generated and stored during the simulated impact executed at the block 810 to determine the amount of energy absorbed by the simulated vehicle component 224.

At a block 830 a mass and/or a speed for a sled 124 used to impact an impactor 120 with a vehicle component 20 is determined. The mass and speed of the sled 124 affect an amount of energy applied to the vehicle component 20 by the impactor 120. Determining the mass and speed of the sled 124 permits the impact between the vehicle component 20 and the impactor 120 to replicate the effect on the simulated vehicle component 224 by the simulated wheel 28 during the simulated impact.

The mass and/or speed for the sled 124 may be based on the amount of energy absorbed by the simulated vehicle component 224 during the simulated impact and determined at the block 825. For example, the Newtonian equation $E=\frac{1}{2}Mv^2$ for kinetic energy may be used where "E" is the amount of energy absorbed by the simulated vehicle component 224 during the simulated impact and determined at the block 825, "M" is a mass of the sled 124 and the structures purported by the sled 124 (e.g., an impactor 120, vehicle component 20, etc.), and "V" is a speed of the sled 124 at a time of impact. Ranges of speeds that may be used for a crash test may be limited, for example, a crash test apparatus 122 may have limitations on speed at which the sled 124 may be moved toward the barrier 126.

The mass and/or speed for the sled 124 may be based on a simulated impact between a simulated sled 230 having a simulated impactor 232 and the simulated vehicle component 224. The computer running CAD software may simulate the impact between the simulated impactor 232 and the simulated vehicle component 224 (shown in FIG. 7), e.g., as described for the simulated impact between the simulated wheel 220 and the simulated vehicle assembly 222. The simulated impact between the sled 124 and the simulated vehicle component 224 may be executed with parameters to replicate a crash test conducted with the sled 124, impactor 120, and/or barrier 126 of the crash test apparatus 122. The parameters may include positions, orientation, and movement (e.g., relative to the x, y, z coordinates of the CAD software) such that simulated impact between the simulated impactor 232 and the simulated vehicle component 224 occurs at the impact angle A1 and the impact location L1 determined in the blocks 815 and 820. Simulated impacts between the simulated sled 230 having the simulated impactor 232 and the simulated vehicle component 224 may be iterated, with parameters specifying mass and/or speed of the sled 124 adjusted between iterations, until deformation of the simulated vehicle component 224 matches deformation of the vehicle component 20 determined in simulated impact executed at the block 810.

At a block 835 the impactor 120 is mounted to a sled 124 and the vehicle component 20 is mounted to a barrier 126, or vice versa. For example, the impactor 120 may be fixed to the sled 124 and the vehicle component 20 may be fixed to the barrier 126 (shown in FIGS. 2-4). The impactor 120 and the vehicle component 20 may be fixed at positions and orientations relative to the sled 124, the barrier 126, the track (or movement direction of the sled 124 toward the barrier 126), etc., based on the impact angle A1 of the simulated impact determined in the block 815. In other words, the impactor 120 and the vehicle component 20 may be fixed to the sled 124 and the barrier 126 such that moment of the sled 124 toward the barrier 126 impacts the impactor 120 with the vehicle component 20 at the impact angle A1 of the simulated impact in the block 810. Similarly, the impactor 120 and the vehicle 22 may be fixed at positions and orientations relative to the sled 124, the barrier 126, the track (or movement direction of the sled 124 toward the barrier 126), etc., based on the impact location L1 of the simulated impact determined in the block 820. In other words, the impactor 120 and the vehicle component 20 may be mounted such that an impact therebetween is a location L2 that is the same as the location L1 of the simulated impact relative to the vehicle component 20 and the simulated vehicle component 224.

Load detecting devices 130 may be supported by the barrier 126 or the sled 124. The load detecting devices 130 are configured to detect force and/or energy applied to the vehicle component 20 during an impact between the impactor 120 and the vehicle component 20. For example, load sensors and/or crush boxes may be mounted between the vehicle component 20 and the barrier 126 or sled 124.

The sled 124 may be configured to have the mass determined in the block 825. For example, weights, such as metal plates or the like, may be added or removed from the sled 124 to configure the mass of the sled 124.

At a block 840, the impactor 120 is impacted with the vehicle component 20. The impactor 120 is impacted with the sled 124 by moving the sled 124 toward the barrier 126, e.g., along the track. The sled 124 may be accelerated before the impact such that the sled 124 is moving at the speed determined in the block 830 at a time of impact. The impact occurs at the impact location L1. In other words, the location where the impactor 120 impacts the vehicle component 20 relative to a datum on the vehicle component 20 is the same as the location L1 where the simulated wheel 220 impacted the simulated vehicle component 224 relative to the datum on the simulated vehicle component 224 and determined in the block 820.

Data from load sensors configured to detect force and/or energy applied to the vehicle component 20 may be recorded while the impactor 120 is impacted with the vehicle component 20. The data may be recorded substantially continuously or at time intervals, e.g., every 10 milliseconds, and stored in memory. Image data, e.g., from a high-speed camera or the like, may also be recorded while the impactor 120 is impacted with the vehicle component 20. The image data may be recorded substantially continuously or at time intervals, e.g., every 10 milliseconds. The image data may include pixels that specify images captured by the camera. The images may be captured from a position and orientation that shows deformation of the vehicle component 20 and/or crush boxes during the impact.

At a block 845 a detected amount of energy absorbed by the vehicle component 20 during the impact executed at the block 840 is compared with the amount of energy absorbed by the simulated vehicle component 224 during the simulated impact executed at the block 810 and determined in the block 825. The energy absorbed by the vehicle component 20 during the impact executed at the block 840 may be detected by the load detecting devices 130. For example, data from load sensors mounted between the vehicle component 20 and the barrier 126 may specify the amount of energy absorbed by the vehicle component 20. As another example, an amount of deformation of crush boxes mounted between the vehicle component 20 and the barrier 126 may indicate the amount of energy absorbed by the vehicle component 20.

The comparison may be used to evaluate the process 800. For example, when the amount of energy absorbed by the vehicle component 20 matches (or is within an a statistically predicted error range) the amount of energy absorbed by the simulated vehicle component 224, a determination may be made that the simulations and physical testing executed throughout the process 800 were generally proper. In other words, the parameters of the simulation, and the setup and execution of the physical test, provided a deformed vehicle component 20 that generally replicated deforming of the vehicle component 20 as a result of a crash test of a complete vehicle 22. When the amount of energy absorbed by the vehicle component 20 does matches the process 500 moves to a block 850. When the amount of energy absorbed by the vehicle component 20 does not match (or is not within an a statistically predicted error range) the amount of energy absorbed by the simulated vehicle component 224, a determination may be made that a flaw may exist in the simulations and physical testing executed throughout the process 800. In other words, one or more parameter of one or more of the simulations may have been inaccurate, the crash test apparatus 122 used for the blocks 835-840 may have been improperly setup, the load sensors may have been faulted, etc. When the amount of energy absorbed by the vehicle component 20 does not match the process 500 may be return to the block 805 and reiterate. Before reiteration parameters of the simulations may be verified. Alternately, the process 800 may end.

At the block 850 a reinforcement area RA on the vehicle component 20 is identified. The reinforcement area RA is an area on the vehicle component 20 that has increased and/or unintended deformation as a result of the impact between the impactor 120 and the vehicle component 20 at the block 840. For example, the vehicle component 20 may include a seam, joint, bend, etc., in and/or between one or more parts 25, 27 of the vehicle component 20. The seam, joint, bent, etc., may split and the parts 25, 27 may separate as a result of the impact at the block 840 (shown in FIG. 4). The split may be identified as the reinforcement area. The reinforcement area may be identified by visual analysis of the vehicle component 20 after being subject to the impact. The visual analysis may be conducted by a human. If no reinforcement area can be identified, the process 800 may end.

At a block 855 reinforcement is added to a second vehicle component 20 based on the reinforcement area. The second vehicle component 20 is the same as the vehicle component 20 in the blocks 835-850. For example, if the vehicle component 20 in the blocks 835-850 is an A-pillar 24, then the second vehicle component 20 is also an A-pillar 24. Adding reinforcement based on the reinforcement area RA strengthens the second vehicle component 20 to prevent the increased and/or unintended deformation as a result of an impact to the second vehicle component 20. The added reinforcement may include adding additional parts to the vehicle component 20, such as additional panels, etc. The added reinforcement may include adding fasteners, adhesive, weld material, etc. For example, if the reinforcement area RA is a split between parts 25, 27, e.g., panels, of the vehicle component 20, then such parts of the second vehicle component 20 may be fixed to each other with at least one of a weld, a fastener, or an adhesive.

An impact between the second vehicle component 20 and an impactor 120 may be performed to test the effectiveness of the added reinforcement, e.g., a described for the blocks 835-850.

At a block 860 a design for the vehicle component 20 is updated based on the reinforcement area. The vehicle component 20 is redesigned to increase strength at the reinforcement area. For example, a geometry, material, etc., of the design for the vehicle component 20 may be changed. After the block 860 the process 500 may return to the block 805 in which parameters for the simulation may be changed such the simulated vehicle component 224 is a model of the vehicle component 20 having the updated design of the block 860. The remainder of the process 800 may be reiterated with the vehicle component 20 having the updated design. Alternately, after the block 860, the process 800 may end.

CONCLUSION

With regard to the process 800 described herein, it should be understood that, although the steps of such process 800 have been described as occurring according to a certain ordered sequence, such process 800 could be practiced with the described steps performed in an order other than the order described herein. It further should be understood that certain steps could be performed simultaneously, that other steps could be added, or that certain steps described herein could be omitted. In other words, the description of the process 800 herein is provided for the purpose of illustrating certain embodiments and should in no way be construed so as to limit the disclosed subject matter.

Computing devices, such as a computer executing CAD software, generally include computer-executable instructions, where the instructions may be executable by one or more computing devices such as those listed above. Computer-executable instructions may be compiled or interpreted from computer programs created using a variety of programming languages and/or technologies, including, without limitation, and either alone or in combination, Java™, C, C++, Visual Basic, Java Script, Python, Perl, etc. Some of these applications may be compiled and executed on a virtual machine, such as the Java Virtual Machine, the Dalvik virtual machine, or the like. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which typically constitutes a main memory. Such instructions may be transmitted by one or more transmission media, including coaxial cables, copper wire and fiber optics, including the wires that comprise a system bus coupled to a processor of a computer. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

In some examples, system elements may be implemented as computer-readable instructions (e.g., software) on one or more computing devices (e.g., servers, personal computers, computing modules, etc.), stored on computer readable media associated therewith (e.g., disks, memories, etc.). A computer program product may comprise such instructions stored on computer readable media for carrying out the functions described herein.

The disclosure has been described in an illustrative manner, and it is to be understood that the terminology which has been used is intended to be in the nature of words of description rather than of limitation. Many modifications and variations of the present disclosure are possible in light of the above teachings, and the disclosure may be practiced otherwise than as specifically described.

What is claimed is:

1. A method, comprising:
   simulating an impact between a simulated vehicle component and a simulated wheel of a simulated vehicle assembly that is a computer-aided-design model;
   determining, based on the simulated impact, an impact angle between the simulated wheel and the simulated vehicle component; and
   impacting an impactor with a vehicle component at the impact angle.

2. The method of claim 1, further comprising fixing the impactor relative to a sled based on the impact angle.

3. The method of claim 1, wherein the impactor includes an arched impact surface.

4. The method of claim 1, further comprising determining an amount of energy absorbed by the simulated vehicle component during the simulated impact.

5. The method of claim 4, further comprising determining at least one of a mass and a speed for a sled used to impact the impactor with the vehicle component based on the amount of energy absorbed by the simulated vehicle component during the simulated impact.

6. The method of claim 5, wherein impacting the impactor with the vehicle component includes using at least one of a sled having the determined mass and a sled moving at the determined speed.

7. The method of claim 4, further comprising comparing a detected amount of energy absorbed by the vehicle component during the impact with the amount of energy absorbed by the simulated vehicle component during the simulated impact.

8. The method of claim 4, wherein determining the amount of energy absorbed by the simulated vehicle component is based on a simulated deformation of the simulated vehicle component during the simulated impact.

9. The method of claim 1, further comprising determining at least one of a mass and a speed for a sled used to impact the impactor with the vehicle component based on a simulated impact between a simulated sled having a simulated impactor and the simulated vehicle component.

10. The method of claim 1, wherein the simulated vehicle assembly includes a simulated vehicle suspension supporting the simulated wheel relative to the simulated vehicle component.

11. The method of claim 1, wherein the simulated vehicle component includes a simulated A-pillar.

12. The method of claim 1, further comprising mounting the impactor to a sled and mounting the vehicle component to a barrier.

13. The method of claim 1, further comprising identifying a reinforcement area on the vehicle component after impacting the impactor with the vehicle component.

14. The method of claim 13, further comprising updating a design for the vehicle component based on the reinforcement area.

15. The method of claim 13, further comprising adding reinforcement to a second vehicle component based on the reinforcement area.

16. The method of claim 15, wherein adding reinforcement includes fixing a first part of the second vehicle component to a second part of the second vehicle component with at least one of a weld, a fastener, or an adhesive.

17. The method of claim 1, further comprising determining an impact location on the simulated vehicle component based on the simulated impact.

18. The method of claim 17, further comprising impacting the impactor with the vehicle component at the impact location.

19. The method of claim 1, further comprising generating the computer-aided-design model of the vehicle component with parameters representative of the vehicle component.

20. The method of claim 1, wherein simulating the impact between the simulated vehicle component and the simulated wheel of the simulated vehicle assembly includes simulating an impact between a simulated barrier and the simulated vehicle assembly.

* * * * *